(12) United States Patent
Tanida et al.

(10) Patent No.: US 7,598,613 B2
(45) Date of Patent: Oct. 6, 2009

(54) FLIP CHIP BONDING STRUCTURE

(75) Inventors: Kazumasa Tanida, Chiba (JP); Osamu Miyata, Kyoto (JP)

(73) Assignee: Rohm Co., Ltd., Kyoto-shi (JP)

( * ) Notice: Subject to any disclaimer, the term of this patent is extended or adjusted under 35 U.S.C. 154(b) by 130 days.

(21) Appl. No.: 11/597,422

(22) PCT Filed: Sep. 1, 2005

(86) PCT No.: PCT/JP2005/015979

§ 371 (c)(1),
(2), (4) Date: Nov. 22, 2006

(87) PCT Pub. No.: WO2006/057097

PCT Pub. Date: Jun. 1, 2006

(65) Prior Publication Data

US 2007/0230153 A1    Oct. 4, 2007

(30) Foreign Application Priority Data

Nov. 25, 2004    (JP)    ............... 2004-341029

(51) Int. Cl.
*H01L 23/48* (2006.01)
*H01L 21/00* (2006.01)
*B23K 31/02* (2006.01)

(52) U.S. Cl. ............ 257/737; 257/738; 257/772; 257/778; 257/780; 257/786; 257/E23.021; 438/108; 228/180.22

(58) Field of Classification Search ............ None
See application file for complete search history.

(56) References Cited

U.S. PATENT DOCUMENTS

| 6,229,220 | B1 * | 5/2001 | Saitoh et al. ............ 257/780 |
| 6,734,556 | B2 * | 5/2004 | Shibata ............ 257/737 |
| 7,382,049 | B2 * | 6/2008 | Ho et al. ............ 257/737 |
| 2002/0149117 | A1 | 10/2002 | Shibata |
| 2004/0169286 | A1 | 9/2004 | Shibata |
| 2007/0164447 | A1 * | 7/2007 | Ho et al. ............ 257/778 |

FOREIGN PATENT DOCUMENTS

| JP | 7-211722 | 8/1995 |
| JP | 2002-289768 | 10/2002 |

OTHER PUBLICATIONS

J.D.Wu et al., "Electromigration Reliability of SnAgXCuX Flip Chip Interconnects", 54th Electronic Components and Technol. Conf., 2004, pp. 961-967.

* cited by examiner

*Primary Examiner*—Alonzo Chambliss
(74) *Attorney, Agent, or Firm*—Rabin & Berdo, PC

(57) ABSTRACT

A semiconductor device is provided with: a solid device having a connection surface formed with a connection electrode projected therefrom; a semiconductor chip which has a functional surface formed with a metal bump projected therefrom and which is bonded to the connection surface of the solid device as directing its functional surface to the connection surface and maintaining a predetermined distance between the functional surface and the connection surface; and a connecting member containing a low melting point metal having a lower solidus temperature than that of the connection electrode and the bump, and interconnecting the connection electrode and the bump. A sum of a height of the connection electrode and a height of the bump is not less than a half of the predetermined distance.

5 Claims, 4 Drawing Sheets

FLIP CHIP BONDING STRUCTURE

TECHNICAL FIELD

The invention relates to a semiconductor device including a flip-chip bonded semiconductor chip.

BACKGROUND ART

A flip chip bonded structure for achieving size reduction and high-density mounting of semiconductor device has been receiving attention. The flip chip bonded structure has a structure wherein a semiconductor chip is connected to a solid device as directing its functional surface to the solid device, the functional surface being formed with a functional element.

FIG. 7 is an illustrative sectional view showing a structure of a conventional semiconductor device having the flip chip bonded structure. The semiconductor device 51 includes: a wiring board 52 having a connection surface 52a; and a semiconductor chip 53 having a functional surface 53a formed with a functional element and connected to the connection surface 52a as directing its functional surface 53a to the connection surface 52a.

The connection surface 52a of the wiring board 52 is formed with a connection pad 58, which is formed of copper (Cu).

An electrode pad 54 connected with the functional element is formed on the functional surface 53a of the semiconductor chip 53. The functional surface 53a is covered with a surface protection film 55, which is formed with an aperture 55 to expose the electrode pad 54. An anti-diffusion film 56 is formed over the aperture 55a in a manner to cover an exposed surface of the electrode pad 54, the surface being exposed through the aperture 55a. As shown in FIG. 7, the anti-diffusion film 56 has a smaller thickness than that of the surface protection film 55, so that the anti-diffusion film 56 does not substantially project from the surfaces of the electrode pad 54 and the anti-diffusion film 56.

A ball-like connecting member 57 formed of a tin(Sb)-lead (Pb) solder material is interposed between the connection pad 58 of the wiring board 52 and the anti-diffusion film 56 of the semiconductor chip 53. Because of the connecting member 57 so interposed, the semiconductor chip 53 is supported as maintaining a predetermined distance from the wiring board 52, while electrical connection between the wiring board 52 and the semiconductor chip 53 is established.

On this account, the connecting member 57 normally has a far greater thickness than those of the connection pad 58 and the anti-diffusion film 56 with respect to a direction in which the wiring board 52 and the semiconductor chip 53 oppose each other.

Non-patent Document 1: J. D. Wu et al., "Electromigration Reliability of SnAg$_x$Cu$_x$ Flip Chip Interconnects", 54$^{th}$ Electron, Components and Technol. Conf., 2004, p. 961.

DISCLOSURE OF THE INVENTION

Problem to Be Solved by the Invention

At 20° C., tin has an electrical resistivity of $12.8 \times 10^{-8} \Omega \cdot cm$, whereas lead has an electrical resistivity of $20.6 \times 10^{-8} \Omega \cdot cm$. Therefore, an electrical resistivity of the connecting member 57 formed of the tin-lead solder material is ten times as much as $1.673 \times 10^{-8} \Omega \cdot cm$ which is an electrical resistivity of copper constituting the connection pad 58.

Therefore, in the structure wherein the connecting member 57 having the much greater thickness than those of the connection pad 58 and the electrode pad 54 is interposed between the connection pad 58 and the electrode pad 54, as illustrated by the semiconductor device 51 of FIG. 7, an electrical resistance between the wiring board 52 and the semiconductor chip 53 is very great. The semiconductor device 51 having such a great electrical resistivity operates so slow that it is not suited for use in high-speed devices. Particularly, in a case where the wiring board 52 or the semiconductor chip 53 is formed with wirings of a fine pattern (including the connection pad 58 or the electrode pad 54), the electrical resistance of the connecting member 57 is significant.

It is therefore an object of the invention to provide a semiconductor device capable of reducing the electrical resistance between the solid device and the semiconductor chip.

Means for Solving the Problem

A semiconductor device according to the invention comprises: a solid device having a connection surface formed with a connection electrode projected therefrom, the connection electrode being formed of a metal; a semiconductor chip which has a functional surface formed with a metal bump projected therefrom and which is bonded to the connection surface of the solid device as directing its functional surface to the connection surface and maintaining a predetermined distance between the functional surface and the connection surface; and a connecting member containing a low melting point metal having a lower solidus temperature than those of the connection electrode and the bump, and interconnecting the connection electrode of the solid device and the bump of the semiconductor chip. With respect to a direction in which the functional surface and the connection surface oppose each other, a sum of a height of the connection electrode and a height of the bump is not less than a half of the predetermined distance.

The connection electrode and/or the bump may be formed of a metal such as gold (Au), copper (Cu) and nickel (Ni). On the other hand, examples of a metal material constituting the connecting member or of the low melting point metal having a lower solidus temperature than those of the connection electrode and the bump include tin, lead, indium and alloys thereof. All these metal materials have higher electrical resistivities than those of gold, copper and nickel.

However, the invention defines that with respect to the opposing direction of the functional surface and the connection surface, the sum of the height of the connection electrode and the height of the bump is not less than a half of the predetermined distance between the functional surface and the connection surface, whereby the connecting member formed of the material having the high electrical resistivity can be decreased in length (thickness). Accordingly, the electrical resistance between the solid device and the semiconductor chip can be reduced. As a result, the semiconductor device is suitable for use in the high-speed devices.

The connecting member may contain an alloy (reaction product) of the low melting point metal and the metal constituting the connection electrode or the bump.

The solidus temperature of the metal material constituting the connecting member may preferably be in the range of, for example, 60° C. to 370° C.

The gap between the connection surface of the solid device and the functional surface of the semiconductor chip may preferably be sealed with a resin material. This resin material serves not only to protect the functional surface, connection portions between the connecting member and the connection electrode and between the connecting member and the bump, but also to reduce in-plane shear stress along the connection surface and the functional surface.

This semiconductor device may be obtained by heating the solid device and the semiconductor chip with the low melting point metal interposed between the connection electrode of the solid device and the bump of the semiconductor chip to temperature higher than the solidus temperature (or more preferably, liquidus temperature) of the low melting point metal for a predetermined period of time. As heated to temperature above the solidus temperature (or liquidus temperature) of the low melting point metal, a melt of the low melting point metal is formed. Then, the melt is solidified to form the connecting member The connection electrode may have a height in the range of, for example, 5 μm to 100 μm, which is greater than that (e.g., 0.5 μm to 5 μm) of the connection pad of the conventional semiconductor device (see FIG. 7). The bump may have a height in the range of, for example, 5 μm to 100 μm, which is greater than that (e.g., 0.5 μm to 5 μm) of the anti-diffusion film of the conventional semiconductor device. The low melting point metal may be used in the connection electrode or the bump having a surface area in the range of, for example, 0.0001 $mm^2$ to 0.25 $mm^2$, as follows. At a region where the connection electrode opposes the bump, the low melting point metal may be present in a volume of, for example, $1 \times 10^{-7}$ $mm^3$ to 0.08 $mm^3$ (on the order of one thousandth part to one fourth part of the volume of the connecting member in the conventional semiconductor device). Thus is established a state where with respect to the opposing direction of the functional surface and the connection surface, the sum of the height of the connection electrode and the height of the bump is not less than a half of the predetermined distance.

The connection electrode may include an upper face opposing the semiconductor chip, and a side face extended substantially along the opposing direction of the solid device and the semiconductor chip. In this case, the bump may include an upper face opposing the solid device, and a side face extended substantially along the opposing direction of the solid device and the semiconductor chip. In this case, the overall areas of the upper face and side face of the connection electrode and of the upper face and side face of the bump may be substantially covered by the connecting member.

According to this constitution, the reliability of the semiconductor device may be improved while the strength of connection between the connection electrode and the bump may be increased.

In the case where the connection electrode and/or the bump have the upper face and the side face, the following advantage may be offered. In the manufacture process of the semiconductor device, the melt of the low melting point metal is allowed to cover the upper face and side face of the connection electrode and/or the bump, so that the surface tension of the melt may be effectively utilized for effecting self-alignment of the semiconductor chip relative to the solid device in a direction perpendicular to the opposing direction thereof.

The connecting member may be laid in a manner to fill in a gap between the connection electrode and the bump, and may include a reacted layer formed of an alloy of a metal constituting the connection electrode or the bump, and the low melting point metal.

Tin, lead, indium and alloys thereof are softer than gold, copper and nickel. Therefore, if the connecting member includes a portion consisting of the low melting point metal between the connection electrode and the bump, the portion is prone to rupture because the portion, which is softer than the connection electrode and the bump, is subjected to stress concentration.

According to this constitution, on the other hand, the gap between the connection electrode and the bump is filled with the reacted layer comprising the alloy of the metal constituting the connection electrode or the bump and the low melting point metal. Such an alloy is harder than the low melting point metal and hence, the connecting member (the reacted layer) interposed between the connection electrode and the bump has a small difference of hardness from those of the connection electrode and the bump. Accordingly, the stress is prevented from being concentrated on the gap between the connection electrode and the bump, so that the connecting member is less prone to rupture In a case where the connection electrode has the upper face and the side face and where the bump has the upper face and the side face, the side faces of the connection electrode and the bump, in addition to the upper faces thereof, may also be covered with the reacted layer.

In the above manufacture process, heating temperature and heating time for the solid device and semiconductor chip may be controlled such that a state where the gap between the connection electrode and the bump is filled with the reacted layer may be attained when the melt of the low melting point metal is solidified.

The connection electrode and the bump may preferably be formed of the same material. In this case, the connection electrode and the bump have symmetrical material construction with respect to the connecting member, such that the reliability of the connection may be increased.

The solid device may be a wiring board. In this case, the connection electrode may be a connection pad connected to a wiring on the wiring board.

Furthermore, the solid device may also be a different semiconductor chip from the above semiconductor chip. That is, this semiconductor device may have a chip-on-chip structure. In this case, the connection surface may be a functional surface formed with a functional element, whereas the connection electrode may be a bump.

The connection electrode and the bump may be formed in different heights so that a connection portion between the connection electrode and the bump is shifted toward the semiconductor chip or the solid device.

In this semiconductor device, an underfill layer may be provided in space between the functional surface of the semiconductor chip and the connection surface of the solid device (functional surface of the another semiconductor chip). When such a semiconductor device is subjected to heat cycling, stress is exerted on the connection electrode, bump and connecting member (which will hereinafter be collectively referred to as "the conductive member") due to a difference between a thermal expansion coefficient of the conductive member and that of the underfill layer. This stress peaks at an intermediate portion between the mutually opposing functional surface and connection surface with respect to the vertical direction to the functional surface and the connection surface.

On the other hand, the connection portion (connecting member) between the bump and the connection electrode (the bump of the another semiconductor chip) is shifted (offset) toward the solid device or the semiconductor chip from the position where the stress exerted on the conductive member peaks (the intermediate portion between the mutually opposing functional surface and connection surface). Therefore, if such an underfill layer is provided, the heat cycling is less likely to cause the rupture at the connection portion between the bump and the connection electrode.

These and other objects, advantages and features of the invention will become apparent from the following description thereof taken in conjunction with the accompanying drawings.

BEST MODES FOR CARRYING OUT THE INVENTION

Figure 1:
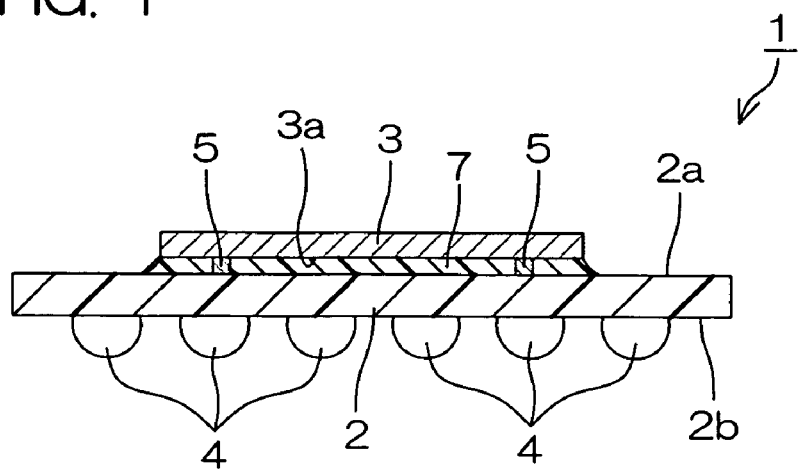
FIG. 1 is an illustrative sectional view showing a structure of a semiconductor device according to a first embodiment of the invention.

FIG. 1 is an illustrative sectional view showing a structure of a semiconductor device according to a first embodiment of the invention.

The semiconductor device 1 includes: a wiring board 2 having a connection surface 2a; and a semiconductor chip 3 having a functional surface 3a formed with a functional element and connected to the connection structure 2a as directing its functional surface 3a to the connection surface 2a. The wiring board 2 and the semiconductor chip 3 are mechanically interconnected by means of a conductive member 5 in a manner to maintain a predetermined distance therebetween. The wiring board 2 and the semiconductor chip 3 are also electrically interconnected via the conductive member 5.

An underfill layer 7 formed from a resin material is interposed in the gap between the wiring board 2 and the semiconductor chip 3. The underfill layer 7 serves not only to protect the functional surface 3a and the conductive member 5 but also to reduce in-plane shear stress along the connection surface 2a and the functional surface 3a.

In the wiring board 2, metal balls 4 are disposed on an external connection surface 2b opposite from the connection surface 2a. The metal balls 4 are re-wired in the wiring board 2 and/or on the surface thereof, so as to be electrically connected to the conductive member 5 on the connection surface 2a side. This semiconductor device 1 may be connected to a mounting board via the metal balls 4.

Figure 2:
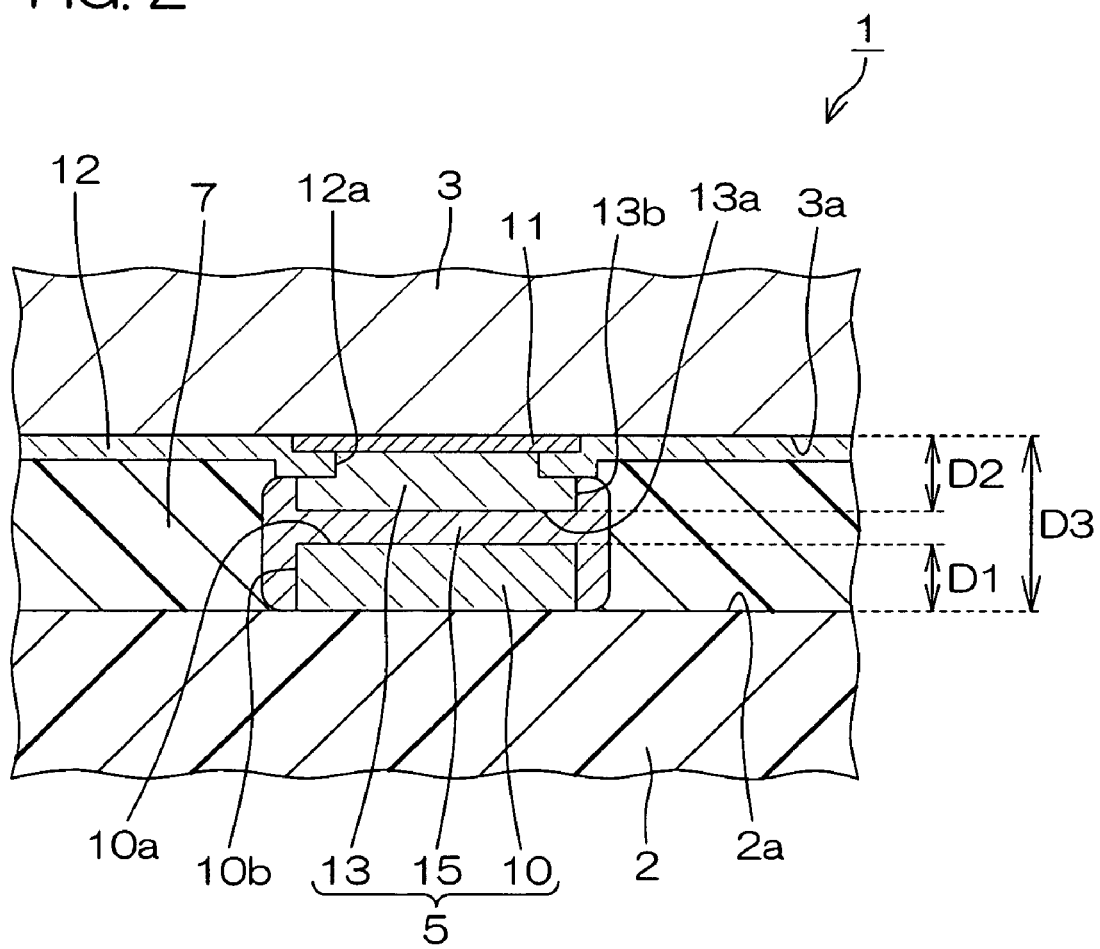
FIG. 2 is an illustrative sectional view showing in enlarged dimension a neighborhood of a conductive member of the semiconductor device shown in FIG. 1.

FIG. 2 is an illustrative sectional view showing in enlarged dimension a neighborhood of the conductive member 5 of the semiconductor device 1.

A connection pad 10 is formed on the connection surface 2a of the wiring board 2. The connection pad 10 is formed of, for example, gold (Au), copper (Cu), nickel (Ni) or an alloy thereof and is connected to the metal ball 4 (see FIG. 1) via an unillustrated wire.

An electrode pad 11 connected with the functional element is formed on the functional surface 3a of the semiconductor chip 3. The electrode pad 11 is formed of, for example, aluminum, copper, gold or an alloy thereof. The functional surface 3a is covered with a surface protection film 12, which is formed with an aperture 12a for exposing the electrode pad 11. The surface protection film 12 is formed of, for example, a silicon nitride film, silicon oxide film or polyimide.

A bump 13 is formed on an exposed surface of the electrode pad 11 through the aperture 12a, projecting from a surface of the surface protection film 12. The bump is formed of, for example, gold, copper, nickel or an alloy thereof.

The connection pad 10 includes: an upper face 10a opposing the semiconductor chip 3 (bump 13); and a side face 10b extending substantially along a direction in which the wiring board 2 and the semiconductor chip 3 oppose each other. Likewise, the bump 13 includes: an upper face 13a opposing the wiring board 2 (connection pad 10); and a side face 13b extending substantially along the opposing direction of the wiring board 2 and the semiconductor chip 3. The bump 13 has substantially the same size and configuration (shape) as those of the connection pad 10. In a plan vertically viewing down the connection surface 2a, the connection pad 10 and the bump 13 are so positioned as to substantially overlap with each other.

The connection pad 10 and the bump 13 are interconnected by means of the connecting member 15. The connecting member 15 contains tin (Sn), lead (Pb), indium (In) or an alloy thereof, as a low melting point metal having a lower solidus temperature than those of the other members of the semiconductor device 1, such as the connection pad 10 and the bump 13. The connecting member 15 includes reacted layers (not shown) near interfaces with the connection pad 10 and the bump 13, the reacted layer comprising an alloy of a low melting point metal and a metal constituting the connection pad 10 or the bump 13. Except for the reacted layers, the connecting member 15 substantially consists of the low melting point metal.

The overall areas of the upper face 10a and side face 10b of the connection pad 10 and of the upper face 13a and side face 13b of the bump 13 are substantially covered by the connecting member 15. This enhances the reliability of the semiconductor device 1 and also increases the strength of connection between the connection pad 10 and the bump 13.

A sum of a height D1 of the connection pad 10 with respect to the connection surface 2a and a height D2 of the bump 13 with respect to the functional surface 3a is not less than a half of a distance D3 between the connection surface 2a and the functional surface 3a (see the following expression (1)).

$$D1 + D2 \geq (1/2) \cdot D3 \qquad (1)$$

The height D1 may be in the range of, for example, 1 μm to 250 μm, and the height D2 may be in the range of, for example, 1 μm to 250 μm. Whereas the height D3 may be in the range of, for example, 1 μm to 500 μm.

The connecting member 15 formed from the low melting point metal such as tin, lead, indium or an alloy thereof, has a higher electrical resistivity than those of the connection pad 10 and the bump 13 formed from gold, copper or nickel. Because of the relation defined by the above expression (1), however, the connecting member 15 having the higher electrical resistivity has a smaller length (thickness) with respect to the opposing direction of the connection surface 2a and the functional surface 3a. Therefore, the semiconductor device 1 is decreased in the electrical resistance between the wiring board 2 and the semiconductor chip 3. This makes the semiconductor device 1 suited for use in high-speed devices.

The connection pad 10 and the bump 13 may preferably be formed of the same material (such as copper). In this case, the connection pad 10 and the bump 13 have symmetrical material construction with respect to the connecting member 15, such that the reliability of the connection may be enhanced.

This semiconductor device 1 may be obtained by heating the wiring board 2 and the semiconductor chip 3 with the low melting point metal interposed between the connection pad 10 of the wiring board 2 and the bump 13 of the semiconductor chip 3 to a temperature higher than the solidus temperature (or more preferably, liquidus temperature) of the low melting point metal for a predetermined period of time. As the device is heated to the temperature above the solidus temperature (or liquidus temperature) of the low melting point metal, a melt of the low melting point metal is formed. Then, the melt is solidified to form the connecting member 15.

The semiconductor device 1 having the relation defined by the above expression (1) may be obtained by setting the heights D1, D2 and the volume of the low melting point metal suitably.

Furthermore, the upper faces 10a, 13a and the side faces 10b, 13b of the connection pad 10 and the bump 13 may be covered by the melt of the low melting point metal, so that the surface tension of the melt may be effectively utilized for effecting self-alignment of the semiconductor chip 3 relative to the wiring board 2.

Figure 3:
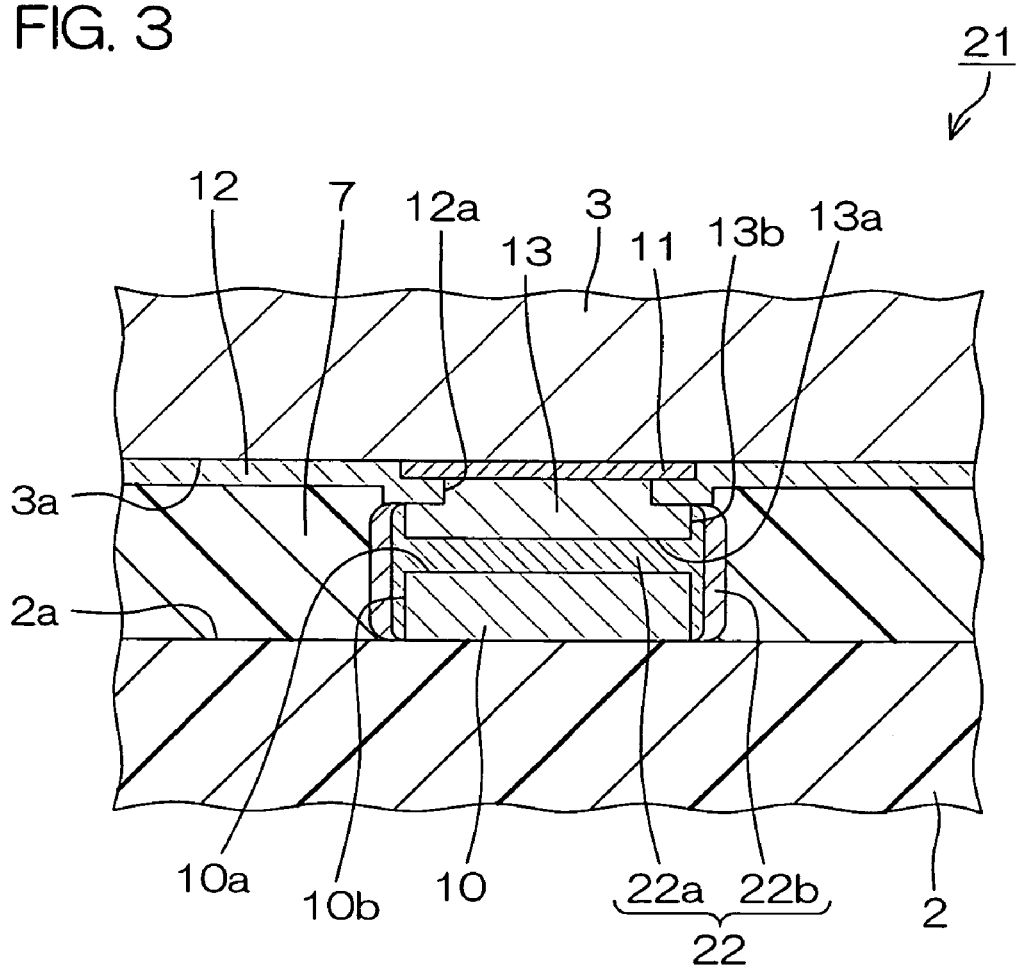
FIG. 3 is an illustrative sectional view showing a structure of a semiconductor device according to a second embodiment of the invention.

FIG. 3 is an illustrative sectional view showing a structure of a semiconductor device according to a second embodiment of the invention. In FIG. 3, those parts corresponding to the individual parts shown in FIG. 2 are represented by the same reference characters as in FIG. 2, respectively.

This semiconductor device 21 includes a connecting member 22 in place of the connecting member 15 of the semiconductor device 1 shown in FIG. 2. The connecting member 22 includes: a reacted layer 22a filled in the gap between the connection pad 10 and the bump 13 and formed to cover the side face 10b of the connection pad 10 and the side face 13b of the bump 13; and an un-reacted layer 22b covering lateral sides of the reacted layer 22a.

The un-reacted layer 22b substantially consists of a low melting point metal (such as tin, lead, indium or an alloy thereof) having a lower solidus temperature than those of the other members of the semiconductor device 21, such as the connection pad 10 and bump 13. On the other hand, the reacted layer 22a consists of an alloy of a metal constituting the connection pad 10 or the bump 13 and the low melting point metal.

Referring to FIG. 2, the low melting point metal such as tin, lead, indium or an alloy thereof is softer than gold, copper and nickel. Therefore, if the connecting member 15 includes a portion substantially consisting of the low melting point metal between the connection pad 10 and the bump 13, as illustrated by the semiconductor device 1, the portion is prone to rupture because the portion, which is softer than the connection pad 10 and the bump 13, is subjected to stress concentration.

In the semiconductor device 21 shown in FIG. 3, on the other hand, the gap between the connection pad 10 and the bump 13 is filled with the reacted layer 22a. The reacted layer 22a consists of the alloy of the metal constituting the connection pad 10 or the bump 13 and the low melting point metal (the alloy may be a eutectic alloy, a solid solution, an intermetallic compound, or a combination of two or more of these). The reacted layer 22a is harder than the low melting point metal and hence, the reacted layer 22a interposed between the connection pad 10 and the bump 13 has a small difference of hardness from those of the connection pad 10 and the bump 13. Accordingly, the stress is prevented from being concentrated on the gap between the connection pad 10 and the bump 13, so that the connecting member 22 is less prone to rupture.

This semiconductor device 21 may be manufactured by the same manufacture process for the semiconductor device 1 shown in FIG. 1 and FIG. 2. In this manufacture process, heating temperature and heating time for the wiring board 2 and semiconductor chip 3 may be controlled, whereby a state where the gap between the connection pad 10 and the bump 13 is filled with the reacted layer 22a may be attained when the melt of the low melting point metal is solidified.

Figure 4:
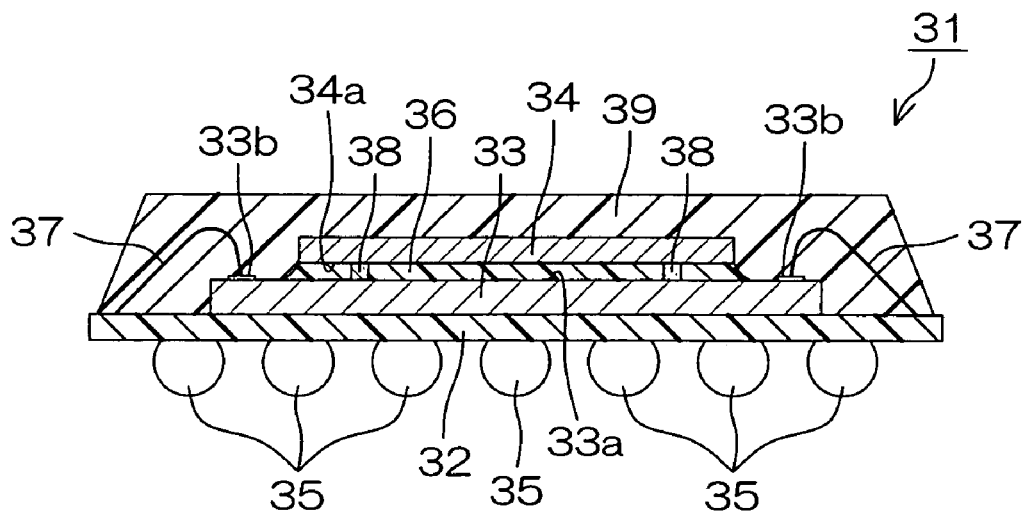
FIG. 4 is an illustrative sectional view showing a structure of a semiconductor device according to a third embodiment of the invention.

FIG. 4 is an illustrative sectional view showing a structure of a semiconductor device according to a third embodiment of the invention.

This semiconductor device 31 is a so-called multi-chip module and includes: a wiring board 32; a first semiconductor chip 33 overlaid thereon; and a second semiconductor chip 34 stacked on the first semiconductor chip 33. The first and second semiconductor chips 33, 34 respectively possess functional surfaces 33a, 34a each formed with a functional element. The first semiconductor chip 33 is mounted on the wiring board 32 in a so-called face-up state where the functional surface 33a is directed to the opposite side from the wiring board 32.

The second semiconductor chip 34 is connected to the first semiconductor chip 33 in a so-called face-down state where the functional surface 34a is directed to the functional surface 33a of the first semiconductor chip 33. That is, this semiconductor device 31 has a chip-on-chip structure. The first semiconductor chip 33 and the second semiconductor chip 34 are mechanically interconnected by means of a conductive member 38 in a manner to maintain a predetermined distance therebetween. The first semiconductor chip 33 and the second semiconductor chip 34 are also electrically interconnected by means of the conductive member 38. An underfill layer 36 is provided in the gap between the first semiconductor chip 33 and the second semiconductor chip 34.

As viewed in a vertical direction to the functional surfaces 33a, 34a, the first semiconductor chip 33 is larger than the second semiconductor chip 34, so that there is, on the first semiconductor chip 33, a region which is not opposed by the second semiconductor chip 34 and which is defined by a circumferential area of its surface portion (functional surface 33a) connected with the second semiconductor chip 34. An electrode pad 33b is formed on this region and is connected to the functional element on the functional surface 33a.

As viewed in a vertical direction to the wiring board 32, the wiring board 32 is larger than the first semiconductor chip 33, so that there is, on the wiring board 32, a region which is not opposed by the first semiconductor chip 33 and which is defined by a circumferential area of its surface portion bonded with the first semiconductor chip 33. An unillustrated electrode pad is formed on this region. The electrode pad on the wiring board 32 and the electrode pad 33b of the first semiconductor chip 33 are interconnected by means of a bonding wire 37.

The first and second semiconductor chips 33, 34 and the bonding wire 37 are encapsulated with a molding resin 39.

The wiring board 32 is provided with solder balls 35, as an external connection member, on its side opposite from the surface bonded with the first semiconductor chip 33. The electrode pad connected with the bonding wire 37 of the wiring board 32 is re-wired on the surface of the wiring board 32 or in the wiring board 32, so as to be connected to the solder ball 35.

This semiconductor device 31 may be mounted on the mounting board by connecting the solder balls 35 to electrode pads formed on the mounting board.

Figure 5:
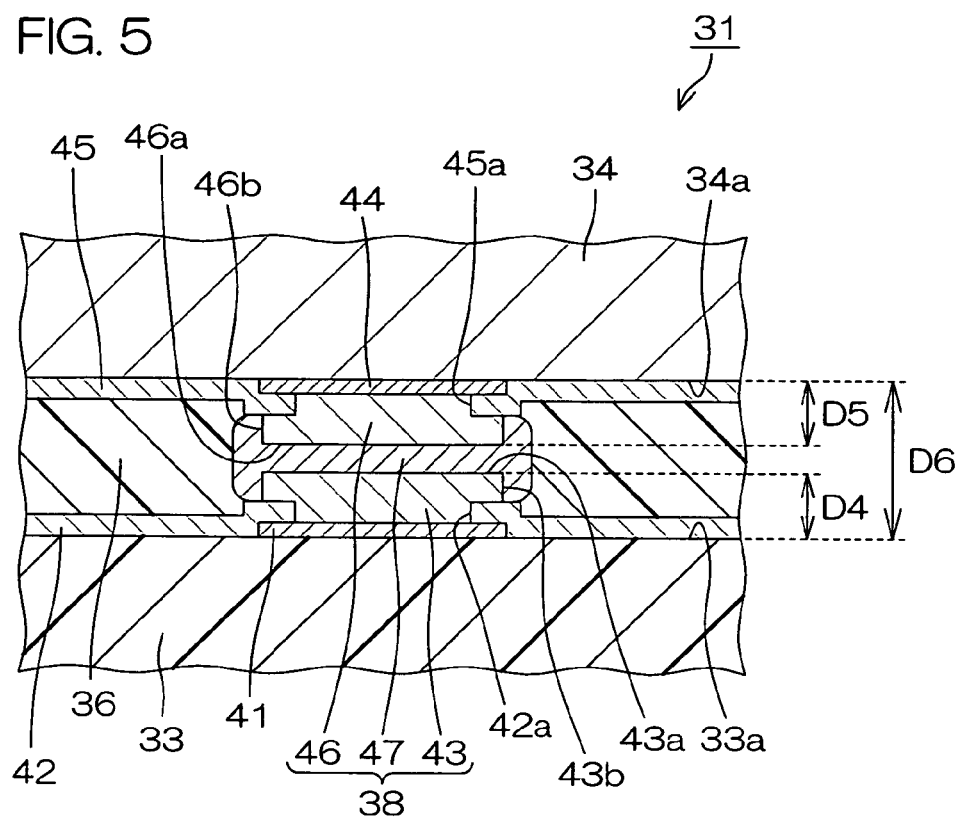
FIG. 5 is an illustrative sectional view showing in enlarged dimension a neighborhood of a conductive member of the semiconductor device shown in FIG. 4.

FIG. 5 is an illustrative sectional view showing in enlarged dimension a neighborhood of the conductive member 38 of the semiconductor device 31.

The functional surface 33a of the first semiconductor chip 33 is formed with an electrode pad 41 connected to the functional element. The functional surface 33a is covered with a surface protection film 42, which is formed with an aperture 42a for exposing the electrode pad 41. A bump 43 projecting from a surface of the surface protection film 42 is formed on an exposed surface of the electrode pad 41 through the aperture 42a.

Likewise, formed on the functional surface 34a of the second semiconductor chip 34 is an electrode pad 44 connected to the functional element. The functional surface 34a is covered with a surface protection film 45, which is formed with an aperture 45a for exposing the electrode pad 44. A bump 46 projecting from a surface of the surface protection film 45 is formed on an exposed surface of the electrode pad 44 through the aperture 45a.

The electrode pads 41, 44 are formed of the same material as that of the electrode pad 11 of the semiconductor device 1 shown in FIG. 2. The surface protection films 42, 45 are formed of the same material as that of the surface protection film 12 of the semiconductor device 1 shown in FIG. 2. The bumps 43, 45 are formed of the same material as that of the bump 13 of the semiconductor device 1 shown in FIG. 2.

The bump 43 has an upper face 43a opposing the second semiconductor chip 34 (bump 43); and a side face 43b extending substantially along a direction in which the first semiconductor chip 33 and the second semiconductor chip 34 oppose each other. Likewise, the bump 46 has an upper face 46a opposing the first semiconductor chip 33 (bump 43); and a side face 46b extending substantially along the opposing direction of the first semiconductor chip 33 and the second semiconductor chip 34. The bump 43 and the bump 46 have substantially the same size and configuration (shape). In plan vertically viewing down the functional surfaces 33a, 34a, the bump 43 and the bump 46 are so positioned as to substantially overlap with each other.

The bump 43 and the bump 46 are interconnected by means of a connecting member 47. The connecting member 47 is formed of the same material as that of the connecting member 15 of the semiconductor device 1 shown in FIG. 2.

The overall areas of the upper face 43a and side face 43b of the bump 43 and of the upper face 46a and side face 46b of the bump 46 are substantially covered by the connecting member 47. This enhances the reliability of the semiconductor device 31 and also increases the strength of connection between the bump 43 and the bump 46.

A sum of a height D4 of the bump 43 with respect to the functional surface 33a and a height D5 of the bump 46 with respect to the functional surface 34a is not less than a half of a distance D6 between the functional surface 33a and the functional surface 34a (see the following expression (2)).

$$D4+D5 \geq (1/2) \cdot D6 \quad (2)$$

That is, the connecting member 47 having the higher electrical resistivity has a small length (thickness) with respect to the opposing direction of the functional surface 33a and the functional surface 34a. Therefore, the semiconductor device 31 is decreased in the electrical resistance between the first semiconductor chip 33 and the second semiconductor chip 34.

Figure 6:
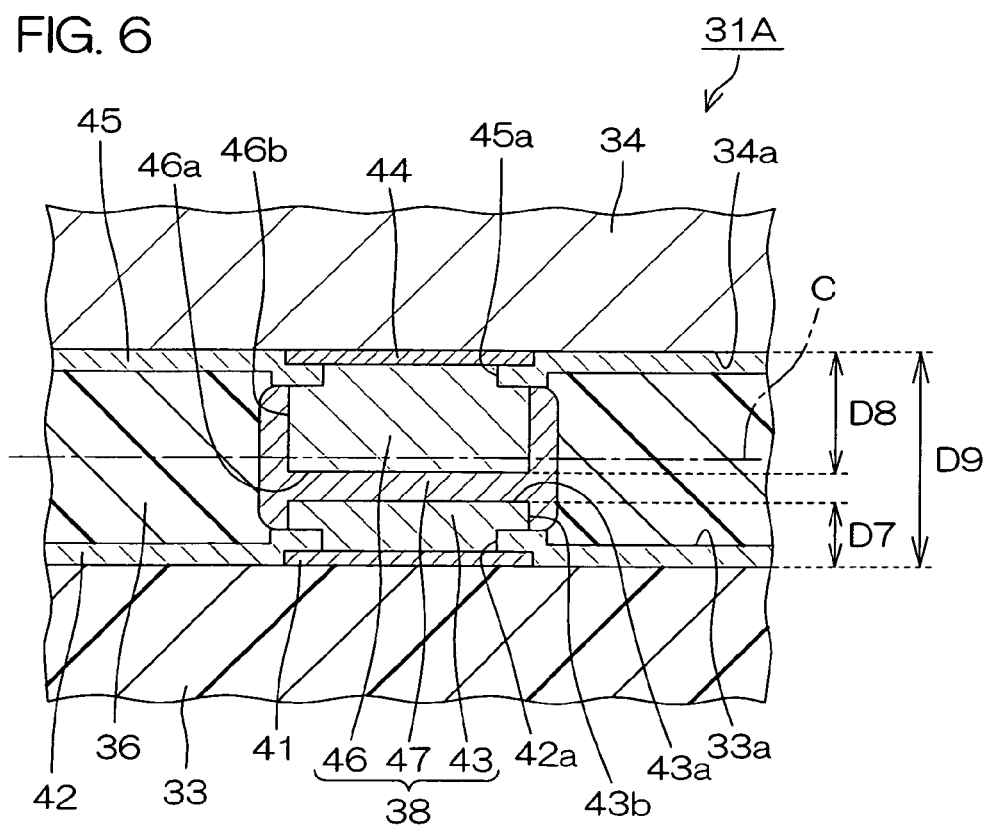
FIG. 6 is an illustrative sectional view showing in enlarged dimension a neighborhood of a conductive member of a modification of the semiconductor device shown in FIG. 4.
Figure 7:
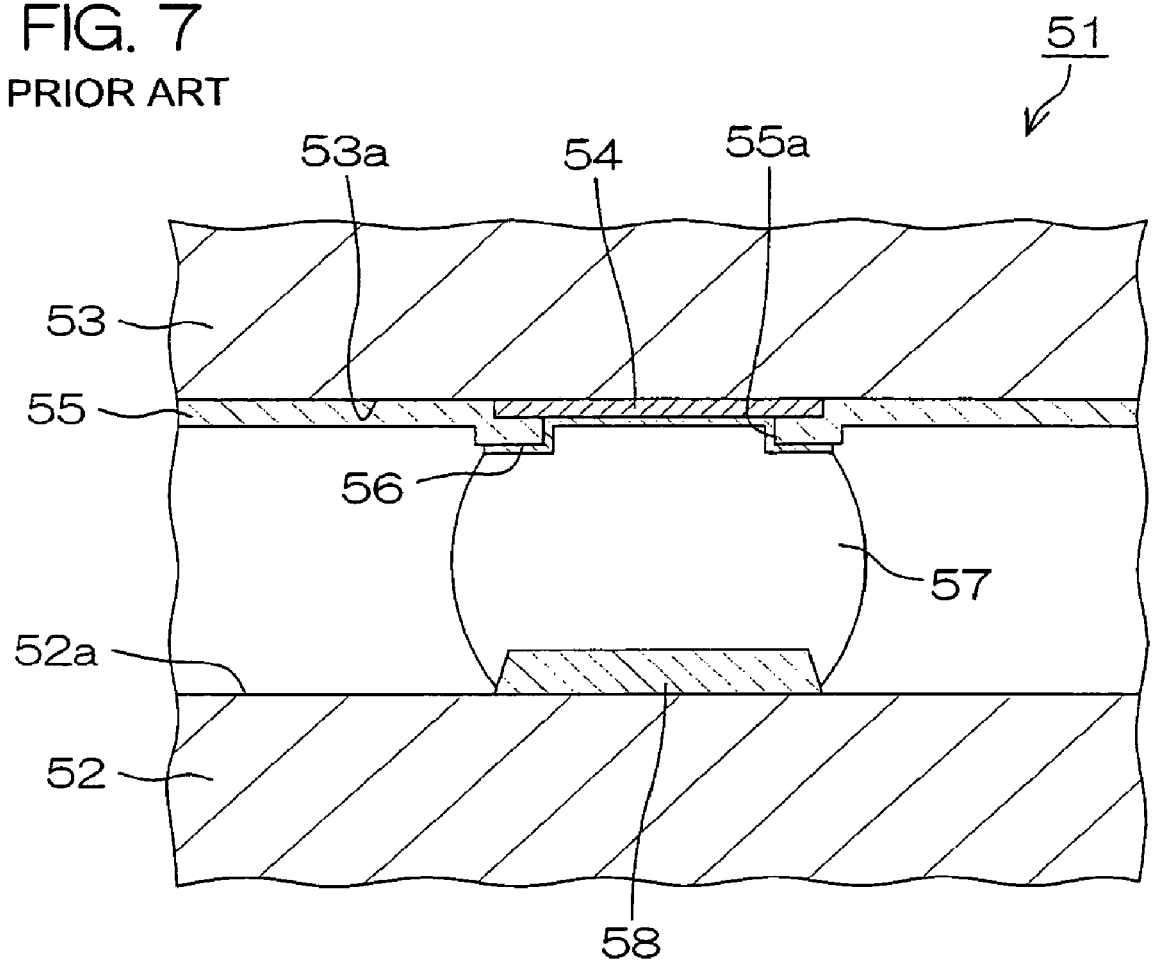
FIG. 7 is an illustrative sectional view showing a structure of a conventional semiconductor device having a flip-chip bonded structure.

FIG. 6 is an illustrative sectional view showing a structure of a modification of the semiconductor device 31 shown in FIG. 4 and FIG. 5. In FIG. 6, those parts corresponding to the individual parts shown in FIG. 5 are represented by the same reference characters in FIG. 5, respectively. FIG. 6 shows in enlarged dimension a neighborhood of the conductive member 38.

In this semiconductor device 31A, a sum of a height D7 of the bump 43 with respect to the functional surface 33a and a height D8 of the bump 46 with respect to the functional surface 34a is not less than a half of a distance D9 between the functional surface 33a and the functional surface 34a (see the following expression (3)).

$$D7+D8 \geq (1/2) \cdot D9 \quad (3)$$

In this semiconductor device 31A, the height D8 of the bump 46 with respect to the functional surface 34a is defined to be greater than the height D7 of the bump 43 with respect to the functional surface 33a (D7<D8).

When the semiconductor device 31A is subjected to heat cycling, stress is exerted on the conductive member 38 due to a difference between a thermal expansion coefficient of the conductive member 38 and that of the underfill layer 36. This stress peaks at an intermediate portion C (indicated by a dot-dash line in FIG. 6) between the mutually opposing functional surface 33a and functional surface 34a with respect to the vertical direction to the functional surfaces 33a, 34a.

On the other hand, a connection portion between the bump 43 and the bump 46 (bump 43-bump 46 interface defined by the connecting member 47) is shifted (offset) toward the first semiconductor chip 33 from the position where the stress exerted on the conductive member 38 peaks (the intermediate portion C between the mutually opposing functional surface 33a and functional surface 34a). Therefore, if such an underfill layer 36 is provided, the heat cycling is less likely to cause the rupture at the connection portion between the bump 43 and the bump 46.

While the embodiments of the invention have been fully described, it is to be noted that the invention may be implemented in any other modes. In the semiconductor device 31 shown in FIG. 5, for example, a reacted layer consisting of an alloy of the metal constituting the bumps 43, 46 and the low melting point metal may also be formed in a manner to fill in the gap between the bump 43 and the bump 46.

In the semiconductor device 31A shown in FIG. 6, what is required is that the height D7 of the bump 43 with respect to the functional surface 33a differs from the height D8 of the bump 46 with respect to the functional surface 34a. Hence, the height D7 of the bump 43 with respect to the functional surface 33a may be greater than the height D8 of the bump 46 with respect to the functional surface 34a (D7>D8).

A detailed description has been made on the embodiments of the invention, which are mere illustrative examples for disclosing the technical nature of the invention, and the invention should not be limited to such illustrative examples. The spirit and scope of the invention should be defined solely by the appended claim.

This application is based on application No. 2004-341029 filed with Japanese Patent Office on Nov. 25, 2004, and the whole disclosure thereof is hereby incorporated by reference.

The invention claimed is;

1. A semiconductor device, comprising:
  a solid device having a connection surface formed with a connection electrode projected therefrom, the connection electrode being formed from a metal and including an upper face opposing a semiconductor chip and a side face extending substantially along an opposing direction, the opposing direction extending from the solid device to the semiconductor chip;

the semiconductor chip having a functional surface formed with a metal bump projected therefrom, the semiconductor chip being bonded to the connection surface of the solid device by directing its functional surface to the connection surface and maintaining a distance between the functional surface and the connection surface, the bump including an upper face opposing the solid device and a side face extending substantially along the opposing direction; and wherein the connecting member is laid in a manner to fill in a gap between the connection electrode and the bump, and includes a reacted layer formed of an alloy of a metal constituting the connection electrode or the bump, and the low melting point metal, the connecting member further includes an un-reacted layer covering lateral sides of the reacted layer a connecting member containing a low melting point metal having a lower solidus temperature than that of the connection electrode and the bump, and interconnecting the connection electrode of the solid device and the bump of the semiconductor chip, wherein the connecting member is laid in a manner to fill in a gap between the connection electrode and the bump, includes a reacted layer formed of an alloy of a metal constituting the connection electrode or the bump, and the low melting point metal; wherein the connecting member further includes an un-reacted layer covering lateral sides of the reacted layer;

wherein a sum of the height of the connection electrode and a height of the bump is not less than a half of the distance between the functional surface and the connection surface, and the overall areas of the upper face and side face of the connection electrode and of the upper face and side face of the bump are substantially covered by the connecting member.

2. A semiconductor device according to claim 1, wherein the connection electrode and the bump are formed of the same material.

3. A semiconductor device according to claim 1, wherein the solid device is a different semiconductor chip from the semiconductor chip.

4. A semiconductor device according to claim 3, wherein the connection electrode and the bump are formed in different heights so that a connection portion between the connection electrode and the bump is shifted toward the semiconductor chip or the solid device.

5. A semiconductor device according to claim 1, further comprising an underfill layer disposed between the solid device and the semiconductor chip.

* * * * *